(12) United States Patent
Zhang (10) Patent No.: US 11,171,316 B2
(45) Date of Patent: Nov. 9, 2021

(54) DISPLAY SUBSTRATE, METHOD FOR PREPARING THE SAME, AND DISPLAY DEVICE

(71) Applicant: BOE TECHNOLOGY GROUP CO., LTD., Beijing (CN)

(72) Inventor: Ziyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 271 days.

(21) Appl. No.: 16/406,360

(22) Filed: May 8, 2019

(65) Prior Publication Data

US 2020/0106055 A1  Apr. 2, 2020

(30) Foreign Application Priority Data

Sep. 30, 2018 (CN) .......................... 201811156775.2

(51) Int. Cl.
*H01L 51/56* (2006.01)
*C09J 7/38* (2018.01)
(Continued)

(52) U.S. Cl.
CPC .............. *H01L 51/56* (2013.01); *C09J 7/381* (2018.01); *H01L 27/3246* (2013.01); *H01L 51/5056* (2013.01); *H01L 51/5072* (2013.01); *H01L 51/5092* (2013.01); *H01L 51/5096* (2013.01); *H01L 51/5221* (2013.01); *H01L 51/5246* (2013.01); *H01L 51/5253* (2013.01)

(58) Field of Classification Search
CPC ............................ H01L 51/56; H01L 51/5056
See application file for complete search history.

(56) References Cited

U.S. PATENT DOCUMENTS

| 2017/0104176 A1 | 4/2017 | Kao et al. | |
| 2019/0140179 A1* | 5/2019 | Chang | H01L 51/56 |
| 2019/0214600 A1* | 7/2019 | Park | H01L 51/52 |

FOREIGN PATENT DOCUMENTS

CN  108321176 A  7/2018

OTHER PUBLICATIONS

1st Chinese Office Action, English Translation.
(Continued)

*Primary Examiner* — Moazzam Hossain
*Assistant Examiner* — Hajar Kolahdouzan
(74) *Attorney, Agent, or Firm* — Brooks Kushman P.C.

(57) ABSTRACT

The present disclosure provides a display substrate, a method for preparing the same, and a display device. The method includes: providing a base substrate including a display region and at least one inner non-display region located inside the display region, with the inner non-display region including an opening region located in the middle of the inner non-display region and a reserved region located around the opening region; forming a mask pattern in the inner non-display region; forming at least one evaporation material layer on the base substrate, with the evaporation material layer being divided by the mask pattern into a first portion of the evaporation material layer formed on the mask pattern and a second portion of the evaporation material formed on other regions; processing the mask pattern; and forming a thin-film encapsulation layer on the base substrate.

18 Claims, 6 Drawing Sheets

(51) Int. Cl.
*H01L 27/32* (2006.01)
*H01L 51/50* (2006.01)
*H01L 51/52* (2006.01)

(56) References Cited

OTHER PUBLICATIONS

CN108321176A, English Abstract and Machine Translation.
First Office Action for Chinese Application No. 201811156775.2, dated Mar. 23, 2020, 6 Pages.

\* cited by examiner

DISPLAY SUBSTRATE, METHOD FOR PREPARING THE SAME, AND DISPLAY DEVICE

CROSS-REFERENCE TO RELATED APPLICATION

This application claims priority to Chinese Patent Application No. 201811156775.2 filed on Sep. 30, 2018, which is incorporated herein by reference in its entirety.

TECHNICAL FIELD

The present disclosure relates to the field of display technology, in particular, to a display substrate, a method for preparing the same and a display device.

BACKGROUND

The application of the display panel is increasingly diversified, and the requirements for the shape of the display panel are also increasing. The traditional active matrix driven display panels are all displayed on the whole surface, and the topology is a plane with only one continuous outer surface. With the changes in market demand, there will be a requirement for display devices with openings in the middle of the screen. For example, a full-screen mobile phone will open a hole in the earpiece, camera, photoelectric sensor, fingerprint recognition, etc., or openings in the middle of the watch allows the hand indicator shaft to pass through, or other display scenes needs to be opened in the middle.

The organic light-emitting diode (OLED) display device is driven by an active matrix thin-film transistor, and the organic layer emits light autonomously, does not need a backlight, a liquid crystal and a light guide plate, and thus is more advantageous for processing a shape cutting display device. At present, the OLED display panel adopts an evaporation process, while the flexible screen adopts a thin film encapsulation (TFE) process. However, the common layer of the evaporation light-emitting layer (EL) material, the cathode, and the inorganic layer of the thin-film encapsulation are all masked by an open mask, and thus can only be used to deposit a continuous film. Since the EL common layer, cathode and TFE film in the center of the screen cannot be patterned, the TFE cannot completely cover the EL common layer and the cathode at the intermediate opening, which are highly susceptible to water and oxygen attack. Therefore, it is necessary to adopt a certain means to realize the encapsulation at the edge of the opening region, to prevent the water and oxygen from attacking the core of the organic light-emitting device from a side, and to improve the reliability of the organic light-emitting device.

SUMMARY

The present disclosure provides a method for preparing a display substrate, including: providing a base substrate including a display region and at least one inner non-display region located inside the display region, with the inner non-display region including an opening region located in the middle of the inner non-display region and a reserved region located around the opening region; forming a mask pattern in the inner non-display region, with the mask pattern covering a whole of the opening region and at least a part of the reserved region; forming at least one evaporation material layer on the base substrate, with the evaporation material layer being divided by the mask pattern into a first portion of the evaporation material layer formed on the mask pattern and a second portion of the evaporation material formed on other regions; processing the mask pattern, such that at least a part of the reserved region between a boundary of the second portion of the evaporation material layer and a boundary of the opening region is not covered by the mask pattern; and forming a thin-film encapsulation layer on the base substrate.

Optionally, the mask pattern is a heat-shrinkable tape.

Further optionally, the processing the mask pattern includes: thermally treating the heat-shrinkable tape such that the heat-shrinkable tape shrinks and deforms, and the first portion of the evaporation material layer and the second portion of the evaporation material layer are separated non-destructively.

Optionally, thermally treating the heat-shrinkable tape includes: integrally heating the base substrate at a heating temperature of 50° C. to 100° C.

Optionally, thermally treating the heat-shrinkable tape includes: locally heating the heat-shrinkable tape by laser, thermal infrared or ray heating.

In an exemplary embodiment, the method for preparing the display substrate further includes: stripping the shrunk and deformed heat-shrink tape, with the first portion of the evaporation material layer on the heat-shrinkable tape being stripped along therewith, after the thermally treating the heat-shrinkable tape and before the forming the thin-film encapsulation layer on the base substrate.

Optionally, the heat-shrinkable tape includes a thin-film substrate and an adhesive superposed one on another.

Optionally, a material of the thin-film substrate is a biaxially stretchable heat-shrinkable material.

Optionally, the material of the thin-film substrate is one or more of polyethylene (PE), polyvinyl chloride (PVC), polyvinylidene chloride (PVDC), polymer optical fiber (POF), oriented polystyrene (OPS), polyethylene terephthalate (PET), poly(ethylene terephthalate-co-1,4-cylclohex-ylenedimethylene terephthalate) (PETG), biaxially oriented polypropylene (OPP) and polypropylene (PP).

Optionally, the adhesive is a pressure-sensitive adhesive whose viscosity is lost due to heat.

Optionally, a material of the adhesive is one or more of polyolefin adhesive, silicone adhesive, and acrylate adhesive.

Optionally, the heat-shrinkable tape has a thickness of 5 μm to 50 μm.

Further, the forming the thin-film encapsulation layer on the base substrate includes: forming a thin-film encapsulation layer including at least one inorganic encapsulation layer and at least one organic encapsulation layer, with a boundary of the organic encapsulation layer being located within the reserved region and spaced apart from the boundary of the opening region by a first distance; and removing the inorganic encapsulation layer in the opening region and a portion of the inorganic encapsulation layer in the reserved region to form a pattern of the inorganic encapsulation layer, with a boundary of the inorganic encapsulation layer is located within the reserved region and spaced apart from a boundary of the opening region by a second distance less than the first distance.

Optionally, the second distance ranges from 20 μm to 500 μm.

In an exemplary embodiment, the method for preparing the display substrate further includes: cutting the opening region to form an opening so as to form a display substrate having a via hole, after the forming the thin-film encapsulation layer on the base substrate.

Optionally, the cutting the opening region to form the opening includes separating the mask pattern along with the opening region of the base substrate.

Optionally, the evaporation material layer includes one or more of a hole injection layer, a hole transport layer, an electron blocking layer, a hole blocking layer, an electron transport layer, an electron injection layer, a cathode, an optical coupling layer, and a protective layer.

In an exemplary embodiment, the method for preparing the display substrate further includes: forming a thin-film transistor, an overcoat, and a pixel defining layer on the base substrate, before the forming the mask pattern in the inner non-display region, in which at least one of an electrode layer of the thin-film transistor, the overcoat, and the pixel defining layer is not located within the opening region.

Another aspect of the present disclosure provides a display substrate, including: a base substrate including a display region and at least one inner non-display region located inside the display region, with the inner non-display region including an opening region located in the middle of the inner non-display region and a reserved region located around the opening region; at least one evaporation material layer on the base substrate, with the evaporation material layer including a first portion of the evaporation material formed on a whole of the opening region and at least a part of the reserved region as well as a second portion of the evaporation material formed on other regions; and a thin-film encapsulation layer on the base substrate, in which at least a part of the reserved region between a boundary of the second portion of the evaporation material layer and a boundary of the opening region is directly covered by thin-film encapsulation layer.

A further aspect of the present disclosure provides a display device including the display substrate as described above.

BRIEF DESCRIPTION OF THE DRAWINGS

In order to illustrate the technical solutions of the present disclosure in a clearer manner, the drawings desired for the embodiments of the present disclosure will be briefly described hereinafter. Obviously, the following drawings merely relate to some embodiments of the present disclosure. Based on these drawings, a person skilled in the art may obtain the other drawings without any creative effort.

DETAILED DESCRIPTION

In order to illustrate the purposes, technical solution and advantages in the embodiments of the present disclosure in a clearer manner, the technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on the described embodiments of the present disclosure, a person skilled in the art may obtain the other embodiments, which also fall within the scope of the present disclosure.

Referring to FIGS. 1 to 9, a method for preparing a display substrate according to an embodiment of the present disclosure includes following steps.

Figure 1:
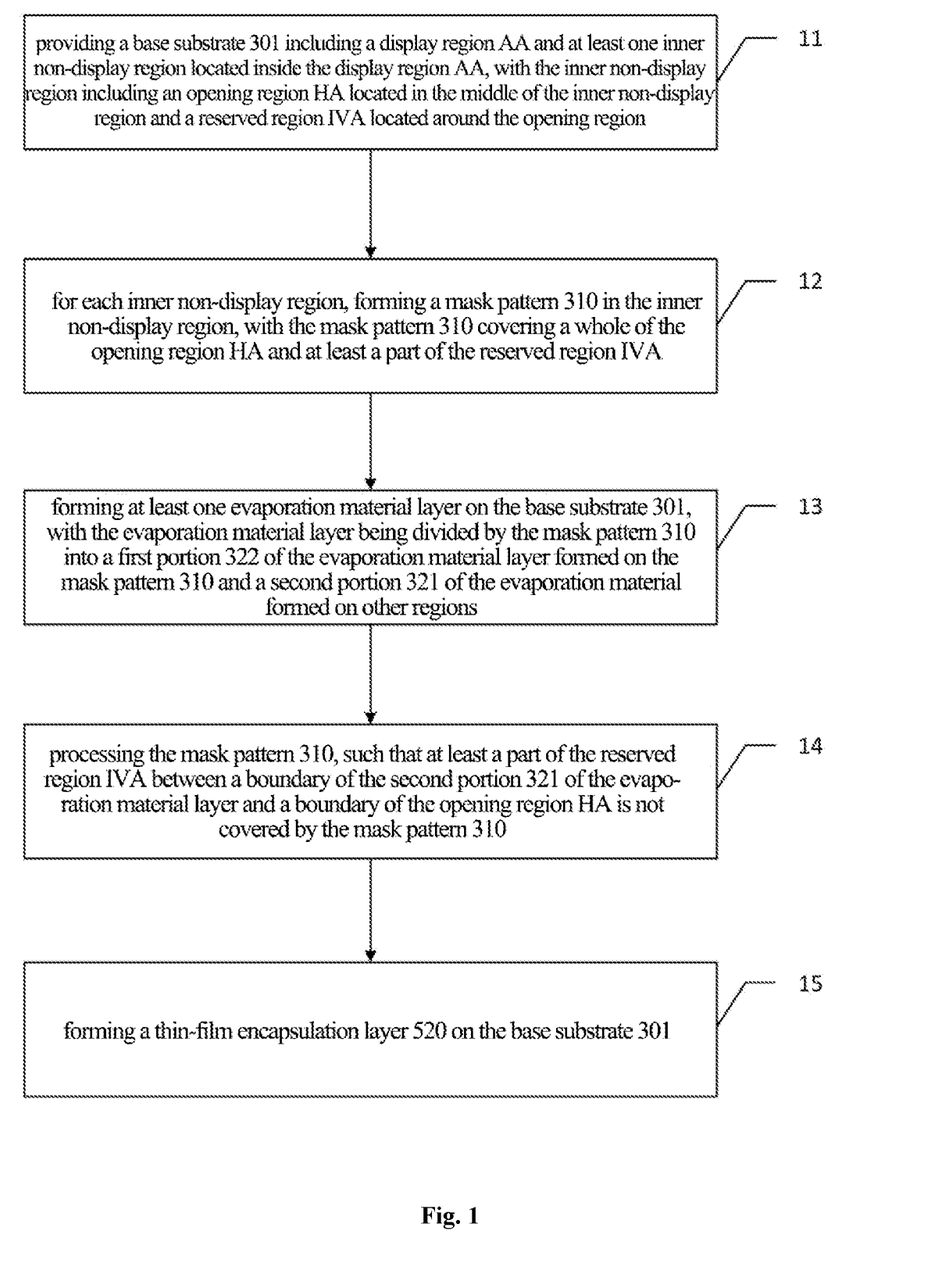
FIG. 1 is a flow chart of a method for preparing a display substrate according to an embodiment of the present disclosure.
Figure 2:
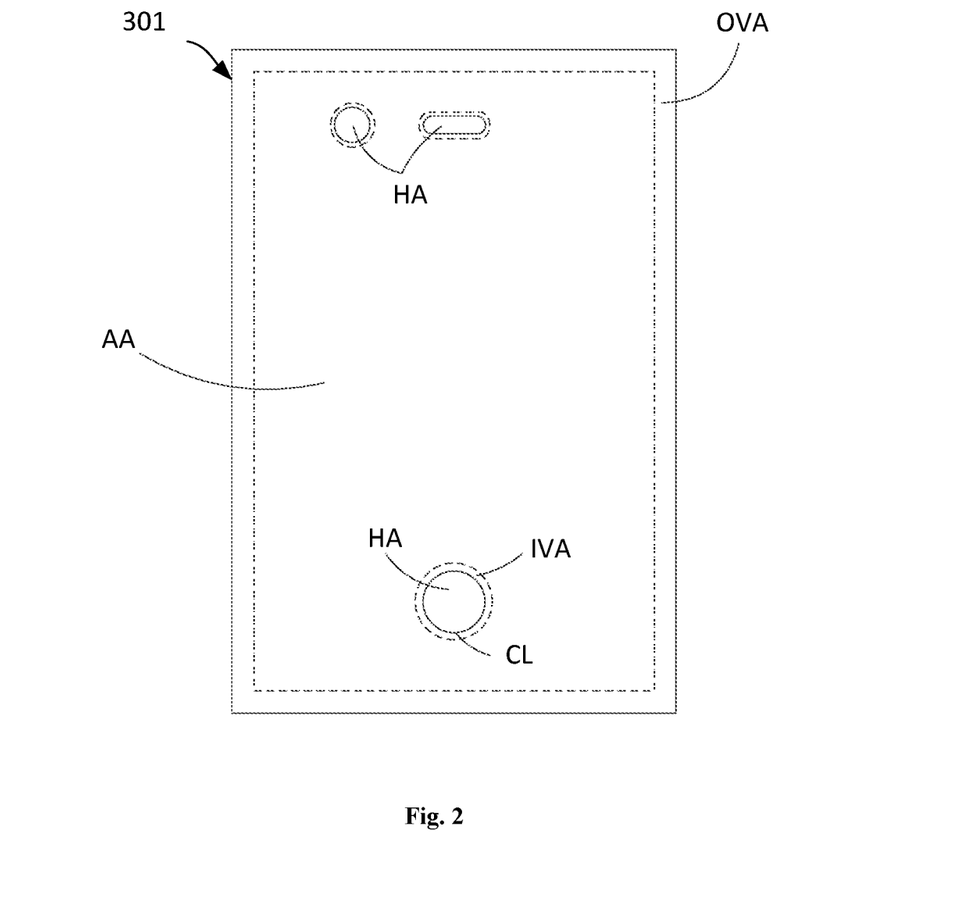
FIG. 2 is a schematic view of a base substrate of a display substrate according to an embodiment of the present disclosure.
Figure 3:
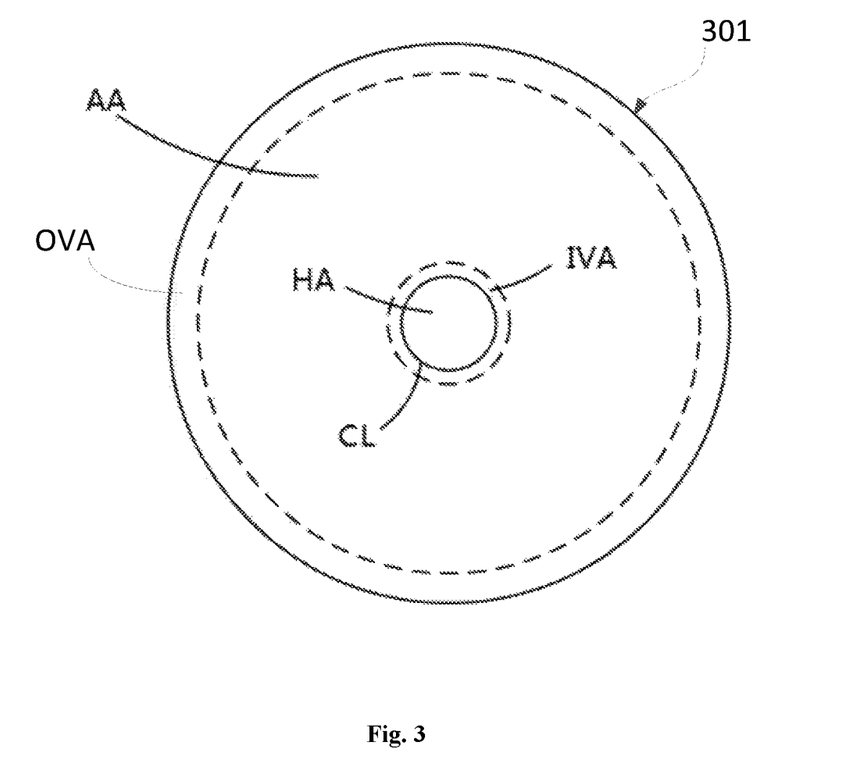
FIG. 3 is a schematic view of a base substrate of a display substrate according to another embodiment of the present disclosure.

Step 11: providing a base substrate 301 including a display region AA and at least one inner non-display region located inside the display region AA, in which the inner non-display region includes an opening region HA located in the middle of the inner non-display region and a reserved region IVA located around the opening region, as shown in FIGS. 2 and 3.

In the embodiment shown in FIG. 2, the base substrate 301 is rectangular and includes three inner non-display regions having different shapes and/or sizes.

In the embodiment shown in FIG. 3, the base substrate 301 is circular and includes one circular inner non-display region located in the central region of the display region AA.

Of course, in some other embodiments of the present disclosure, the number of inner non-display regions is not limited to 1 or 3, and the shape and the size are not limited to those shown in FIGS. 2 and 3.

In addition, in the embodiment of the present disclosure, the base substrate 301 further includes: an outer non-display region OVA located in a periphery of the display region AA. The CL in FIGS. 2 and 3 is a boundary line of the opening region HA, which is also referred to as a cutting line.

Figure 4:
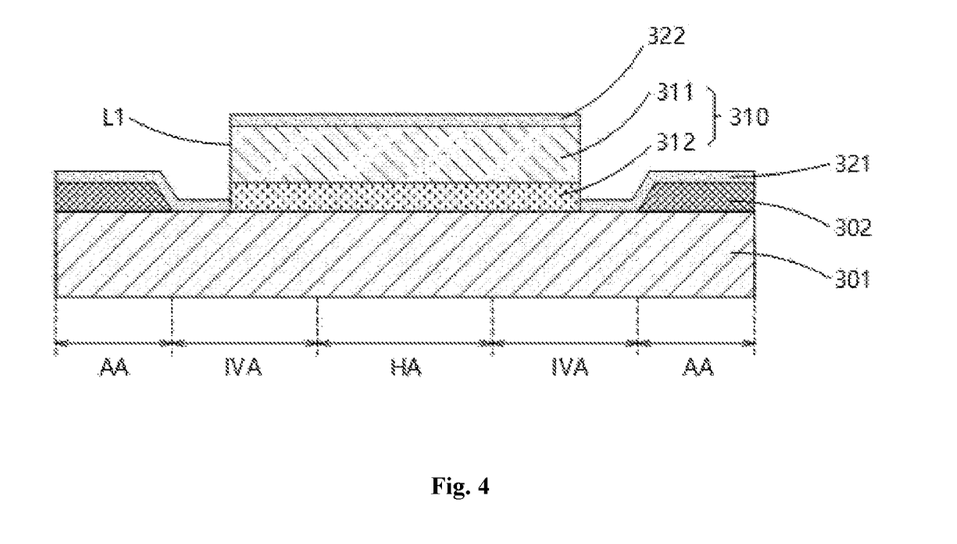
FIGS. 4 to 9 are process schematics of a method for preparing a display substrate according to an embodiment of the present disclosure.

Step 12: for each inner non-display region, forming a mask pattern 310 in the inner non-display region, in which the mask pattern covers a whole of the opening region HA and at least a part of the reserved region IVA, as shown in FIG. 4.

In the embodiment shown in FIG. 4, the mask pattern 310 covers a whole of the opening region HA and at least a part of the reserved region IVA. That is, the boundary of the mask pattern 310 is located within the reserved region IVA and optionally adjacent to the display region AA.

Figure 10:
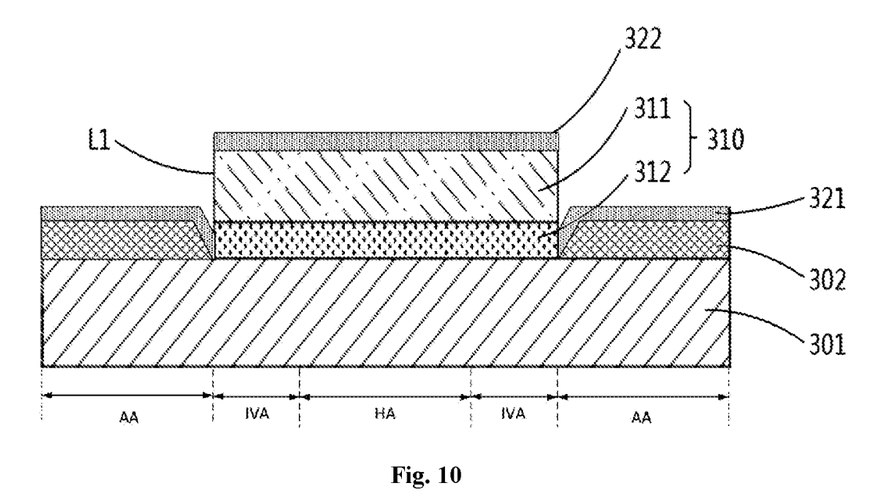
FIG. 10 is a schematic view of a method for preparing a display substrate according to another embodiment of the present disclosure.

In some other embodiments of the present disclosure, the mask pattern 310 may also cover the entire region of the opening region HA and the entire region of the reserved region IVA, that is, the mask pattern 310 completely covers the inner non-display region, i.e., the boundary of the mask pattern 310 is the outer boundary of the reserved region IVA, as shown in FIG. 10.

Step 13: forming at least one evaporation material layer on the base substrate 301, in which the evaporation material layer is divided by the mask pattern 310 into a first portion 322 of the evaporation material layer formed on the mask pattern 310 and a second portion 321 of the evaporation material formed on other regions, shown in FIG. 4.

Figure 5:
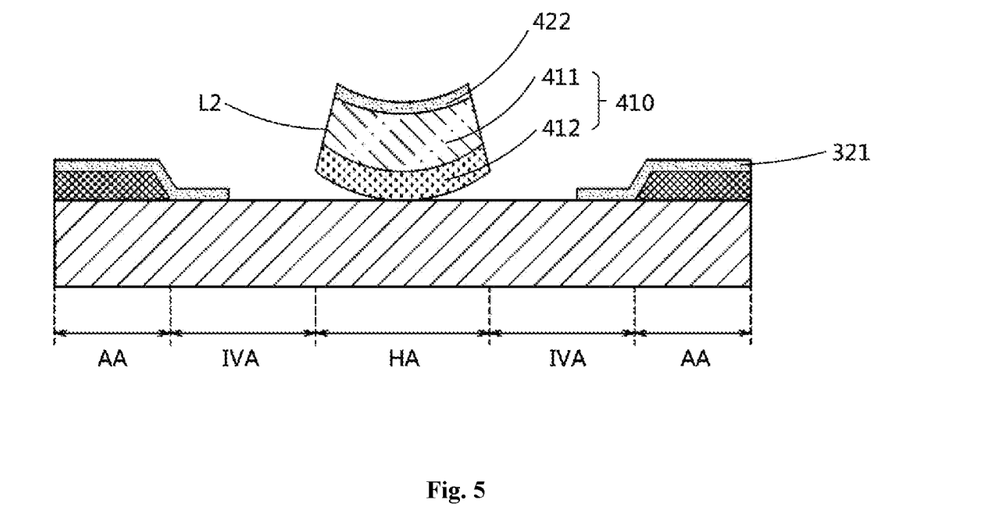

Step 14: processing the mask pattern 310, such that at least a part of the reserved region IVA between a boundary of the second portion 321 of the evaporation material layer and a boundary of the opening region HA is not covered by the mask pattern 310, as shown in FIG. 5. In FIG. 5, 410 is a processed mask pattern.

Figure 8:
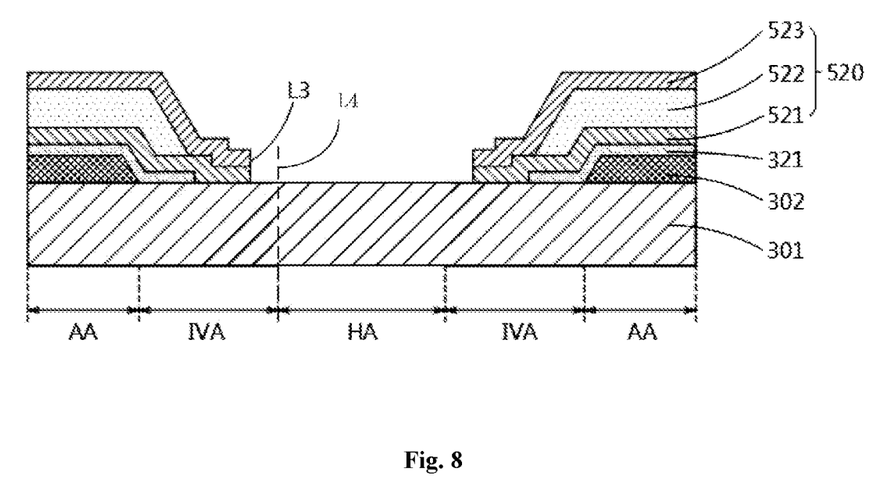

Step 15: forming a thin-film encapsulation layer 520 on the base substrate 301, as shown in FIG. 8.

In the embodiment of the present disclosure, the mask pattern 310 is formed in the inner non-display region IVA for forming the opening. After forming an evaporation material layer through an evaporation process, the evaporation material layer is divided by the mask pattern 310 into a first portion 322 of the evaporation material layer located on the mask pattern 310 and a second portion 321 of the evaporation material layer located in other regions. The mask pattern 310 is processed, such that at least a part of the reserved region IVA between a boundary of the second portion 321 of the evaporation material layer and a boundary of the opening region HA is not covered by the mask pattern 310. After the thin-film encapsulation layer 520 is formed, the boundary of the thin-film encapsulation layer 520 is closer to the opening region HA as compared with the boundary of the second portion of the evaporation material layer 321, so as to completely cover the boundary of the second portion of the evaporation material layer 321, avoid exposing the evaporation material to outside the thin-film encapsulation layer 520 after the cutting to form openings, ensure the evaporation material layer around the opening region HA to be encapsulated completely, prevent water and oxygen from attacking the evaporation material layer, and improve the reliability of the display device having the display substrate. At the same time, the above-mentioned preparation method has a small influence on the existing structure and is extremely low destructive.

Further, the method for preparing the display substrate may further include the following steps.

Figure 9:
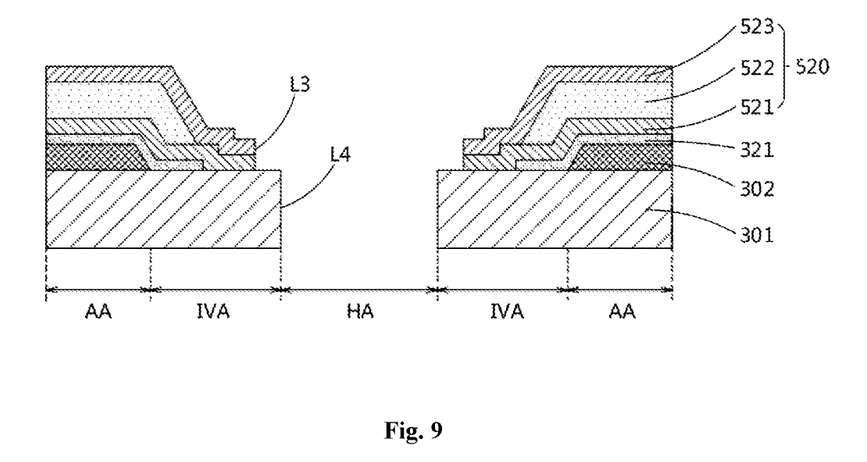

Step 16: cutting the opening region HA to form a display substrate having a via hole, after the forming of the thin-film encapsulation layer on the base substrate 520, such that the display substrate is suitable for the demand for the opening in the middle of the screen, as shown in FIG. 9.

Optionally, the substrate may be cut to form holes by laser or mechanical means.

Of course, in some other embodiments of the present disclosure, the cutting of the opening region HA to form openings may not be performed in the preparation of the display substrate, instead, the cutting of the opening region HA to form holes after forming the display panel having the display substrate. The display panel having the display substrate may further include, for example, a cover plate covering the display substrate or the like, in which the display substrate and the cover plate may be simultaneously cut during the cutting to form openings.

In some optional embodiments of the present disclosure, the mask pattern 310 may be a heat-shrinkable tape. The so-called heat-shrinkable tape shrinks after heating. The heat-shrinkable tape is used as a mask pattern, in which the mask pattern can be removed by heating. Thus, the removal method is simple, and does not affect other film layers of the display substrate. The heat-shrinkable tape in the embodiment of the present disclosure may include a film substrate 311 and an adhesive 312 superposed one on another, as shown in FIG. 4.

In the embodiment of the present disclosure, the material of the film substrate 311 may be a biaxially stretchable heat-shrinkable material having a good heat-shrink function. The film substrate 311 made of the biaxially stretchable heat-shrinkable material can be shrunk in the center direction after heating, so that the coverage region of the heat-shrinkable tape becomes small. Optionally, the film substrate 311 has a heat shrinkage rate of 30% or more.

In the embodiment of the present disclosure, the material of the film substrate 311 may be one or more of PE (polyethylene), PVC (polyvinyl chloride), PVDC (polyvinylidene chloride), POF (polymer optical fiber), OPS (oriented polystyrene), PET (polyethylene terephthalate), PETG (poly(ethylene terephthalate-co-1,4-cylclohexylenedimethylene terephthalate)), OPP (biaxially oriented polypropylene) and polypropylene (PP). When there is a plurality of materials it means that the thin-film substrate 311 is formed by mixing the plurality of materials.

In the embodiment of the present disclosure, the adhesive 312 may be a pressure-sensitive adhesive whose viscosity is lost due to heat, which ensures that the substrate 311 does not fall down in the evaporation process of the base substrate 301 facing downward. At the same time, the adhesive force of the pressure-sensitive adhesive whose viscosity is lost due to heat is lower than a preset threshold, so that there is no residual adhesive after the heat is stripped.

In the embodiment of the present disclosure, the material of the adhesive 312 is at least one of a hot melt pressure sensitive adhesive, such as a polyolefin adhesive, an organosilicone adhesive, or an acrylate adhesive. When there is a plurality of materials it means that the adhesive 312 is formed by mixing the plurality of materials.

In the embodiment of the present disclosure, the heat-shrinkable tape may have a thickness of 5 to 50 μm. When the display substrate is an organic light-emitting display substrate, the thickness shall not affect the material evaporation process for the light-emitting layer (for example, an RGB light-emitting layer) using an FMM (fine metal mask). At the same time, due to the existence of a certain thickness, it is also ensured that the evaporation material layer subjected to an evaporation is divided by the heat-shrinkable tape into the first portion 322 of the evaporation material layer and the second portion 321 of the evaporation material layer.

In the embodiment of the present disclosure, as shown in FIG. 5, when the mask pattern 310 is a heat-shrinkable tape, the processing the mask pattern may include: thermally treating the heat-shrinkable tape such that it shrinks and deforms, and the first portion 322 of the evaporation material layer and the second portion 321 of the evaporation material layer are separated non-destructively. In FIG. 5, the heat-shrinkable tape is heated so that the heat-shrinkable tape shrinks toward the center, the edge is warped and even agglomerates, thereby forming the heat-shrunk and deformed heat-shrink tape 410. The heat shrunk and deformed heat-shrink tape 410 includes the heat-shrunk and deformed film substrate 411 and the heat-shrunk and deformed adhesive 412. The heat-shrunk and deformed heat-shrink tape 410 has a cover region smaller than that of the heat-shrinkable tape before the heat shrinking and deformation. At the same time, the first portion of the evaporation material layer 322 on the heat-shrinkable tape shrinks toward the center along with the heat-shrinkable tape to become 422, and non-destructively separates from the second portion 321 of the evaporation material layer.

In the embodiment of the present disclosure, the heat treating the heat-shrinkable tape may include: integrally heating the substrate at a heating temperature of 50° C. to 100° C. Since the heating temperature is low, it may avoid damaging the evaporation material layer. Optionally, the heat-shrinkable tape is locally heated by laser, thermal infrared or ray heating. Local heating can be performed at a higher temperature, for example above 100° C., in order to obtain a better heat-shrink effect. At the same time, laser, thermal infrared or ray heating can also ensure the accuracy of heating and avoid damage to other layers.

Figure 6:
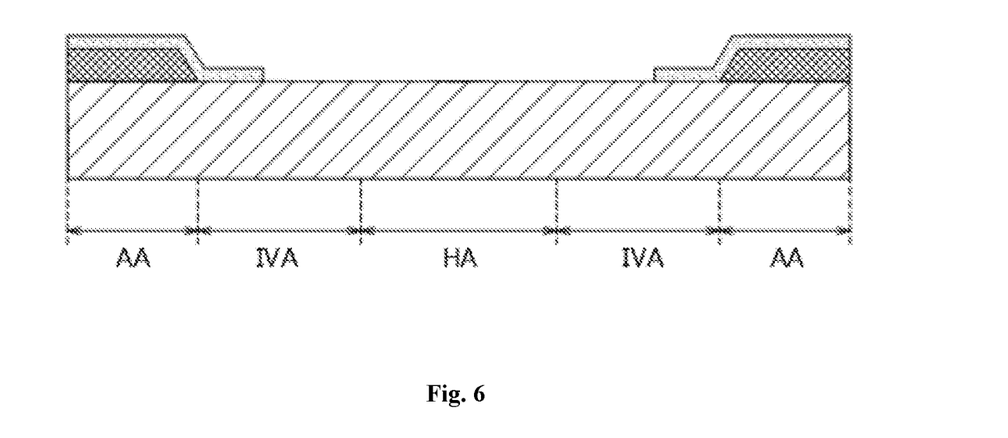

In the embodiment of the present disclosure, the method for preparing the display substrate may further includes:

Step 14A: stripping the shrunk and deformed heat-shrink tape, with the first portion of the evaporation material layer on the heat-shrinkable tape being stripped along therewith, after the thermally treating the heat-shrinkable tape such that it shrinks and deforms and before the forming the thin-film encapsulation layer on the base substrate, as shown in FIG. 6. Before the thin-film encapsulation layer is formed, the heat-shrunk and deformed heat-shrink tape is stripped, so that the heat-shrink tape does not affect the subsequent formation process of the thin-film encapsulation layer.

In the embodiment of the present disclosure, since the adhesive 312 has a low adhesive force after being heated and the heat-shrink tape is warped as a whole, it is easily stripped from the base substrate 301 by mechanical, suction or blowing means. Optionally, the base substrate 301 is maintained face downward during the stripping, thus, the particles falling down in the stripping process are prevented from contaminating the front surface of the base substrate 301, which is more advantageous for reducing the impact on other structures on the base substrate 301 in the stripping process.

Of course, in other embodiments of the present disclosure, before the forming of the thin-film encapsulation layer, the heat-shrunk and deformed heat-shrink tape may not be stripped, instead, when the opening region is cut to form openings so as to form a via hole, the heat-shrink tape is separated along with the base substrate of the opening region, thereby reducing one stripping process and reducing production cost.

In the above embodiment, the mask pattern 310 being the heat-shrinkable tape is taken as an example. Of course, in some other embodiments of the present disclosure, the mask pattern 310 may also be other types of mask patterns, as long as the evaporation material layer can be broken into two parts and the evaporation material layer above the mask pattern can be removed by removing the mask pattern.

Figure 7:
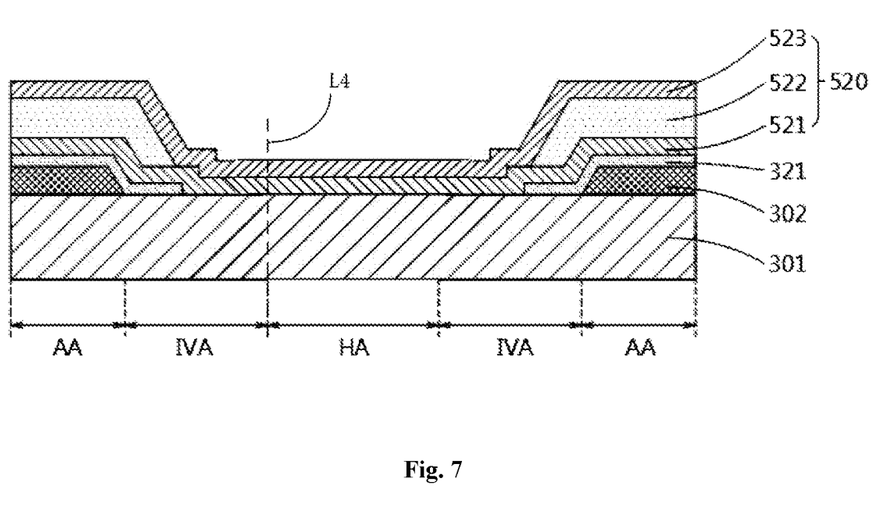

In the embodiment of the present disclosure, the forming the thin-film encapsulation layer on the base substrate includes:

Step 151: forming a thin-film encapsulation layer including at least one inorganic encapsulation layer (521, 523) and at least one organic encapsulation layer 522, in which a boundary of the organic encapsulation layer 522 is located within the reserved region IVA and spaced apart from the boundary L4 of the opening region A by a first distance, as shown in FIG. 7.

In the embodiment shown in FIG. 7, the thin-film encapsulation layer includes two inorganic encapsulation layers (a first inorganic encapsulation layer 521 and a second inorganic encapsulation layer 523) and an organic encapsulation layer 522 located between the two inorganic encapsulation layers. The boundary of the organic encapsulation layer 522 is wrapped within the boundaries of the first inorganic encapsulation layer 521 and the second inorganic encapsulation layer 523, to prevent moisture from penetrating through the side edges along the organic encapsulation layer 522 and reducing the encapsulation effect.

Step 152: removing the inorganic encapsulation layer in the opening region HA and a portion of the inorganic encapsulation layer in the reserved region to form a pattern of the inorganic encapsulation layer, in which a boundary L3 of the inorganic encapsulation layer is located within the reserved region and spaced apart from a boundary L4 of the opening region HA by a second distance less than the first distance, as shown in FIG. 8.

In the embodiment of the present disclosure, the inorganic encapsulation layer in the opening region HA and a portion of the inorganic encapsulation layer in the reserved region IVA may be removed by a photolithography process, and a dry etching process may be employed in the photolithography process.

In the embodiment of the present disclosure, the second distance may range from 20 μm to 500 μm, which ensures the encapsulation effect of the inorganic encapsulation layer and prevents cracks resulting from the effect on the inorganic encapsulation layer when the base substrate is cut from affecting the encapsulation effect.

In the embodiment of the present disclosure, a portion of the inorganic encapsulation layer in the reserved region is removed, so that the boundary of the inorganic encapsulation layer and the opening region HA have a certain interval, which prevents cracks resulting from the effect on the inorganic encapsulation layer when the base substrate is cut from affecting the encapsulation effect.

Of course, in some other embodiments of the present disclosure, if the cutting process is ideal, the inorganic encapsulation layer is not affected by cracking. In this case, the inorganic encapsulation layer may not be patterned.

In the embodiment of the present disclosure, the display substrate may be an organic light-emitting display substrate, and the evaporation material layer in the above embodiment is a evaporation material layer of the organic light-emitting device on the organic light-emitting display substrate, and the evaporation material layer includes at least one of: a hole injection layer (HIL), a hole transport layer (HTL), an electron blocking layer (EBL), a hole blocking layer (HBL), an electron transport layer (ETL), an electron injection layer (EIL), a cathode (CTD), an optical coupling layer (CPL) and a protective layer. The latter layer is highly susceptible to be attacked by water and oxygen. The above method can ensure that the evaporation material layer around the opening region to be encapsulated completely, prevent water and oxygen from attacking the evaporation material layer, and improve the reliability of the display device having the display substrate.

Of course, the display substrate of the present disclosure may also be other types of display substrates.

In the embodiment of the present disclosure, the method for preparing the display substrate further includes:

Step 11A: forming a thin-film transistor (TFT) 302, an overcoat (not shown), and a pixel defining layer (not shown) on the base substrate 301, before the forming of the mask pattern 310 in the inner non-display region, in which at least one of an electrode layer of the thin-film transistor 302, the overcoat, and the pixel defining layer is not located within the opening region, so as to reduce the difficulty of subsequent cutting.

The thin-film transistor 302 is connected to the organic light-emitting device. Each material layer in the thin-film transistor 302 can be patterned by a photolithographic mask.

Further optionally, at least one of the electrode layer of the thin-film transistor 302, the overcoat and the pixel defining layer is not located within the inner non-display region.

The embodiment of the present disclosure further provides a display substrate prepared by the above-mentioned preparation method.

In the embodiment of the present disclosure, the shape of the display substrate may be a rectangle as shown in FIG. 2, or a ring shape as shown in FIG. 3.

An embodiment of the present disclosure further provides a display device including the display substrate as described above.

The display device in the embodiment of the present disclosure may be a mobile phone, a tablet computer, a personal digital assistant, a smart watch, a car display, a digital camera, a notebook computer, a head-up display, a wearable device, a virtual reality or an augmented reality device.

In the embodiment of the present disclosure, the display region of the display device includes at least one via hole for placing an earpiece, a camera, a photoelectric sensor, a distance sensor, an infrared sensor, a fingerprint recognition sensor, an acoustic sensor, a pointer, a button or a knob, or the like; or leaving only a blank to achieve design results.

The advantageous effects of the above technical solutions of the present disclosure are shown as follows.

In the embodiment of the present disclosure, a mask pattern is formed on the inner non-display region for forming the opening, and after the evaporation material layer is formed by an evaporation process, the evaporation material layer is divided by the mask pattern into the first portion of the evaporation material layer located on the mask pattern and a second portion of the evaporation material layer located in other regions. Then, the mask pattern is processed such that at least a part of the reserved region between a boundary of the second portion of the evaporation material layer and a boundary of the opening region is not covered by the mask pattern. After the thin-film encapsulation layer is formed, the boundary of the thin-film encapsulation layer is closer to the opening region as compared with the boundary of the second portion of the evaporation material layer, so as to completely cover the boundary of the second portion of the evaporation material layer, avoid exposing the evaporation material to the outside after the cutting to form openings, ensure the evaporation material layer around the opening region to be encapsulated completely, prevent water and oxygen from attacking the evaporation material layer, and improve the reliability of the display device having the display substrate. At the same time, the above-mentioned preparation method has a small influence on the existing structure and is extremely low destructive.

Unless otherwise defined, technical terms or scientific terms used herein have the normal meaning commonly understood by one skilled in the field to which the present disclosure pertains. The words "first", "second", and the like used in the present disclosure does not denote any order, quantity, or importance, but rather merely serves to distinguish different components. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

The above descriptions are optional embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A method for preparing a display substrate, comprising:
providing a base substrate comprising a display region and at least one inner non-display region located inside the display region, with the inner non-display region comprising an opening region located in the middle of the inner non-display region and a reserved region located around the opening region;
forming a mask pattern in the inner non-display region, with the mask pattern covering a whole of the opening region and at least a part of the reserved region;
forming at least one evaporation material layer on the base substrate, with the evaporation material layer being divided by the mask pattern into a first portion of the evaporation material layer formed on the mask pattern and a second portion of the evaporation material formed on other regions;
processing the mask pattern, such that at least a part of the reserved region between a boundary of the second portion of the evaporation material layer and a boundary of the opening region is not covered by the mask pattern; and
forming a thin-film encapsulation layer on the base substrate.

2. The method of claim 1, wherein the mask pattern is a heat-shrinkable tape.

3. The method of claim 2, wherein the processing the mask pattern comprises:
thermally treating the heat-shrinkable tape such that the heat-shrinkable tape is shrunk and deformed, and the first portion of the evaporation material layer and the second portion of the evaporation material layer are separated non-destructively.

4. The method of claim 3, wherein the thermally treating the heat-shrinkable tape comprises:
integrally heating the base substrate at a heating temperature of 50° C. to 100° C.

5. The method of claim 3, wherein the thermally treating the heat-shrinkable tape comprises:
locally heating the heat-shrinkable tape by laser, thermal infrared or ray heating.

6. The method of claim 3, further comprising:
stripping the shrunk and deformed heat-shrink tape, with the first portion of the evaporation material layer on the heat-shrinkable tape being stripped along therewith, after the thermally treating the heat-shrinkable tape and before the forming the thin-film encapsulation layer on the base substrate.

7. The method of claim 2, wherein the heat-shrinkable tape comprises a thin-film substrate and an adhesive superposed one on another.

8. The method of claim 7, wherein a material of the thin-film substrate is a biaxially stretchable heat-shrinkable material.

9. The method according to claim 7, wherein the material of the thin-film substrate is one or more of polyethylene (PE), polyvinyl chloride (PVC), polyvinylidene chloride (PVDC), polymer optical fiber (POF), oriented polystyrene (OPS), polyethylene terephthalate (PET), poly(ethylene terephthalate-co-1,4-cylclohexylenedimethylene terephthalate) (PETG), biaxially oriented polypropylene (OPP) and polypropylene (PP).

10. The method of claim 7, wherein the adhesive is a pressure-sensitive adhesive whose viscosity is lost due to heat.

11. The method of claim 7, wherein a material of the adhesive is one or more of polyolefin adhesive, silicone adhesive, and acrylate adhesive.

12. The method of claim 2, wherein the heat-shrinkable tape has a thickness of 5 μm to 50 μm.

13. The method of claim 1, wherein the forming the thin-film encapsulation layer on the base substrate comprises:
forming the thin-film encapsulation layer comprising at least one inorganic encapsulation layer and at least one organic encapsulation layer, with a boundary of the organic encapsulation layer being located within the reserved region and spaced apart from the boundary of the opening region by a first distance; and
removing the inorganic encapsulation layer in the opening region and a portion of the inorganic encapsulation layer in the reserved region to form a pattern of the inorganic encapsulation layer, with a boundary of the inorganic encapsulation layer is located within the reserved region and spaced apart from a boundary of the opening region by a second distance less than the first distance.

14. The method of claim 13, wherein the second distance ranges from 20 μm to 500 μm.

15. The method of claim 1, further comprising:
cutting the opening region to form an opening so as to form a display substrate having a via hole, after the forming the thin-film encapsulation layer on the base substrate.

16. The method of claim 15, wherein the cutting the opening region to form the opening comprises separating the mask pattern along with the opening region of the base substrate.

17. The method of claim 1, wherein the evaporation material layer comprises one or more of a hole injection layer, a hole transport layer, an electron blocking layer, a hole blocking layer, an electron transport layer, an electron injection layer, a cathode, an optical coupling layer, and a protective layer.

18. The method of claim 1, further comprising:
forming a thin-film transistor, an overcoat, and a pixel defining layer on the base substrate, before the forming the mask pattern in the inner non-display region, wherein at least one of an electrode layer of the thin-film transistor, the overcoat, or the pixel defining layer is not located within the opening region.

* * * * *